United States Patent
Ishida et al.

(10) Patent No.: US 10,461,238 B2
(45) Date of Patent: Oct. 29, 2019

(54) THERMOELECTRIC CONVERSION STRUCTURE AND METHOD FOR MAKING THE SAME

(71) Applicant: NEC Corporation, Tokyo (JP)

(72) Inventors: Masahiko Ishida, Tokyo (JP); Akihiro Kirihara, Tokyo (JP); Asuka Fukue, Tokyo (JP)

(73) Assignee: NEC Corporation, Tokyo (JP)

( * ) Notice: Subject to any disclaimer, the term of this patent is extended or adjusted under 35 U.S.C. 154(b) by 199 days.

(21) Appl. No.: 14/740,826

(22) Filed: Jun. 16, 2015

(65) Prior Publication Data

US 2015/0380630 A1    Dec. 31, 2015

(30) Foreign Application Priority Data

Jun. 26, 2014  (JP) .................................. 2014-131640

(51) Int. Cl.
*H01L 37/00*    (2006.01)

(52) U.S. Cl.
CPC .................................. *H01L 37/00* (2013.01)

(58) Field of Classification Search
None
See application file for complete search history.

(56) References Cited

U.S. PATENT DOCUMENTS

2013/0312802 A1*  11/2013  Kirihara .................. H01L 37/00
                                                                      136/201

FOREIGN PATENT DOCUMENTS

| JP | S63-055906 A | 3/1988 |
| JP | H01-140701 A | 6/1989 |
| JP | 2005-285867 A | 10/2005 |
| JP | 2009-130070 A | 6/2009 |
| JP | 2011-249746 A | 12/2011 |
| WO | WO-2013/011971 A1 | 1/2013 |
| WO | WO-2014/010286 A1 | 1/2014 |

OTHER PUBLICATIONS

Japanese Office Action issued by the Japan Patent Office for Japanese Application No. 2014-131640 dated Feb. 20, 2018 (4 pages).

* cited by examiner

*Primary Examiner* — Shannon M Gardner

(74) *Attorney, Agent, or Firm* — Wilmer Cutler Pickering Hale and Dorr LLP

(57) ABSTRACT

A thermoelectric conversion structure according to an exemplary aspect of the invention includes a thermoelectric conversion unit structure including a magnetic fine particle including a magnetic material with the spin Seebeck effect arising and an electromotive body with which to cover the magnetic fine particle, wherein a plurality of the thermoelectric conversion unit structures form an aggregate with the electromotive body connecting to each other.

20 Claims, 9 Drawing Sheets

THERMOELECTRIC CONVERSION STRUCTURE AND METHOD FOR MAKING THE SAME

This application is based upon and claims the benefit of priority from Japanese Patent Application No. 2014-131640, filed on Jun. 26, 2014, the disclosure of which is incorporated herein in its entirety by reference.

TECHNICAL FIELD

The present invention relates to thermoelectric conversion structures and methods for making the same and, in particular, to a thermoelectric conversion structure and a method for making the same using the spin Seebeck effect and the inverse spin Hall effect.

BACKGROUND ART

In recent years, an electronic technology called "spintronics" has been attracting lots of attention. While traditional electronics has utilized only "electric charge" that is one property of an electron, the spintronics also utilizes actively a "spin" which is another property of an electron in addition to the electric charge. In particular, a "spin-current", that is, a flow of the spin angular momentum of an electron is an important characteristic. Since the spin-current has weak energy dissipation, there is a possibility of realizing highly efficient information propagation by utilizing the spin-current. Accordingly, it has become an important subject of research to generate, detect, and control the spin-current.

With respect to the generation of the spin-current, for example, a phenomenon has been known that the spin-current is generated if an electric current flows. This phenomenon is called the "spin Hall effect". The reverse phenomenon has been also known that an electromotive force is generated if the spin-current flows. This is called the "inverse spin Hall effect". By utilizing the inverse spin Hall effect, it is possible to detect the generation of the spin-current as that of an electromotive force or an electric current. The spin Hall effect and the inverse spin Hall effect both appear prominently in substances with large spin orbit coupling, for example platinum (Pt), palladium (Pd), and the like.

Recent research has revealed that the spin Seebeck effect appears in magnetic materials. The spin Seebeck effect is a phenomenon that the spin-current is induced, if a temperature gradient is applied to the magnetic material, parallel to the direction of the temperature gradient (see Japanese Patent Application Laid-Open Publication No. 2009-130070 and Japanese Patent Application Laid-Open Publication No. 2011-249746, for example). That is to say, a thermal spin-current conversion of converting heat into the spin-current is made to arise by the spin Seebeck effect. It is described in Japanese Patent Application Laid-Open Publication No. 2009-130070 that the spin Seebeck effect appears in a NiFe film, which is a ferromagnetic material. It is described in Japanese Patent Application Laid-Open Publication No. 2011-249746 that the spin Seebeck effect appears in the interface between a metallic film and a magnetic insulating material such as yttrium iron garnet ($Y_3Fe_5O_{12}$:YIG).

Here, the spin-current induced by the temperature gradient can be converted into an electric field (an electric current or an electric voltage) by using the inverse spin Hall effect mentioned above. That is to say, it becomes possible to realize "a spin thermoelectric conversion" of converting the temperature gradient into electricity through the spin by utilizing both the spin Seebeck effect and the inverse spin Hall effect.

Next, the operation of the thermoelectric conversion element which uses such spin thermoelectric conversion technology will be described (see Japanese Patent Application Laid-Open Publication No. 2009-130070 and Japanese Patent Application Laid-Open Publication No. 2011-249746, for example). FIG. 9 is a schematic, perspective view to illustrate the operation of the thermoelectric conversion in a related spin-current thermoelectric conversion element. The related spin-current thermoelectric conversion element is configured to be a longitudinal type.

The related longitudinal spin-current thermoelectric conversion element is composed of a magnetic body and an electromotive body which are connected to each other. The magnetic body is magnetized in a negative x direction in FIG. 9. If the temperature gradient is applied in a negative z direction, a thermal spin-current flows in a positive z direction, that is, it flows from a high temperature region to a low temperature region. The thermal spin-current makes a pure spin-current arise in the electromotive body through a process called a spin injection near to the interface between the magnetic body and the electromotive body. Here, the spin injection is a phenomenon that the spin in the magnetic body, processing around the magnetization direction near to the interface between the magnetic body and the electromotive body, interacts with a conduction electron without spin in the electromotive body, and transfers or receives a spin angular momentum.

By the spin injection, the conduction electron with spin moves to the neighborhood of a spin injection interface in the electromotive body, and the pure spin-current is generated. In the pure spin-current, the same amounts of the conduction electron with up-spin and that with down-spin flow in opposite directions with each other. As a result, although there is no charge transfer, only spin angular momentum flows because the sign of the spin differs from each other.

In the following description of the present specification, it is referred to as being magnetically coupled to be in a state in which the spin injection phenomenon can arise. The spin injection phenomenon can arise not only in a case where the magnetic body is in immediate contact with the electromotive body but also in a case where they are so close to each other that the spin angular momentum can be transferred even if they are not in immediate contact with each other. That is to say, even though there is a void between the magnetic body and the electromotive body or an intermediate layer is inserted between them, there is a magnetic coupling if the spin injection phenomenon can arise.

If the electromotive body is made of a material with large spin orbit coupling, the transfer of the conduction electron arises by the inverse spin Hall effect. This conduction electron is transferred in a direction perpendicular to each of the spin-current direction and the magnetization direction. As a result, an electric current is generated which flows either in a positive y direction or in a negative y direction depending on the properties of the materials of the electromotive body.

In such a spin-current thermoelectric conversion element, the magnitude of electromotive force to be obtained can be calculated by multiplying the magnitude of the spin-current arising in the magnetic body by an injection efficiency of the spin-current at the interface between the magnetic body and the electromotive body, and an efficiency of conversion into the electromotive force by means of the inverse spin Hall effect in the electromotive body. Therefore, in order to improve the basic performance of the related spin-current thermoelectric conversion element, it is necessary to increase at the same time three indexes of the magnitude of the spin-current itself, the spin-current injection efficiency, and a spin-current to electric current conversion efficiency of the electromotive body.

The related technologies are described in Japanese Patent Application Laid-Open Publication No. 2005-285867 and Japanese Patent Application Laid-Open Publication No. H01-140701.

SUMMARY

An exemplary object of the invention is to provide a thermoelectric conversion structure and a method for making the same that solve a problem that flexible implementation to a heat source becomes difficult and the production costs are raised adopting a structure to increase the output power in a thermoelectric conversion element using the spin-current.

A thermoelectric conversion structure according to an exemplary aspect of the invention includes a thermoelectric conversion unit structure including a magnetic fine particle including a magnetic material with the spin Seebeck effect arising and an electromotive body with which to cover the magnetic fine particle, wherein a plurality of the thermoelectric conversion unit structures form an aggregate with the electromotive body connecting to each other.

A method for making a thermoelectric conversion structure according to an exemplary aspect of the invention includes forming a magnetic fine particle by using a magnetic material with the spin Seebeck effect arising; forming a thermoelectric conversion unit structure by covering the magnetic fine particle with a electromotive body; and forming an aggregate of a plurality of thermoelectric conversion unit structures by connecting a plurality of the electromotive bodies included in the plurality of thermoelectric conversion unit structures to each other.

BRIEF DESCRIPTION OF THE DRAWINGS

Exemplary features and advantages of the present invention will become apparent from the following detailed description when taken with the accompanying drawings in which.

EXEMPLARY EMBODIMENT

An exemplary embodiment of the present invention will be described below with reference to the drawings.

A First Exemplary Embodiment

A thermoelectric conversion structure in accordance with a first exemplary embodiment of the present invention includes a thermoelectric conversion unit structure including a magnetic fine particle including a magnetic material with the spin Seebeck effect arising and an electromotive body with which to cover the magnetic fine particle. A plurality of the thermoelectric conversion unit structures form an aggregate with the electromotive body connecting to each other.

Figure 1:
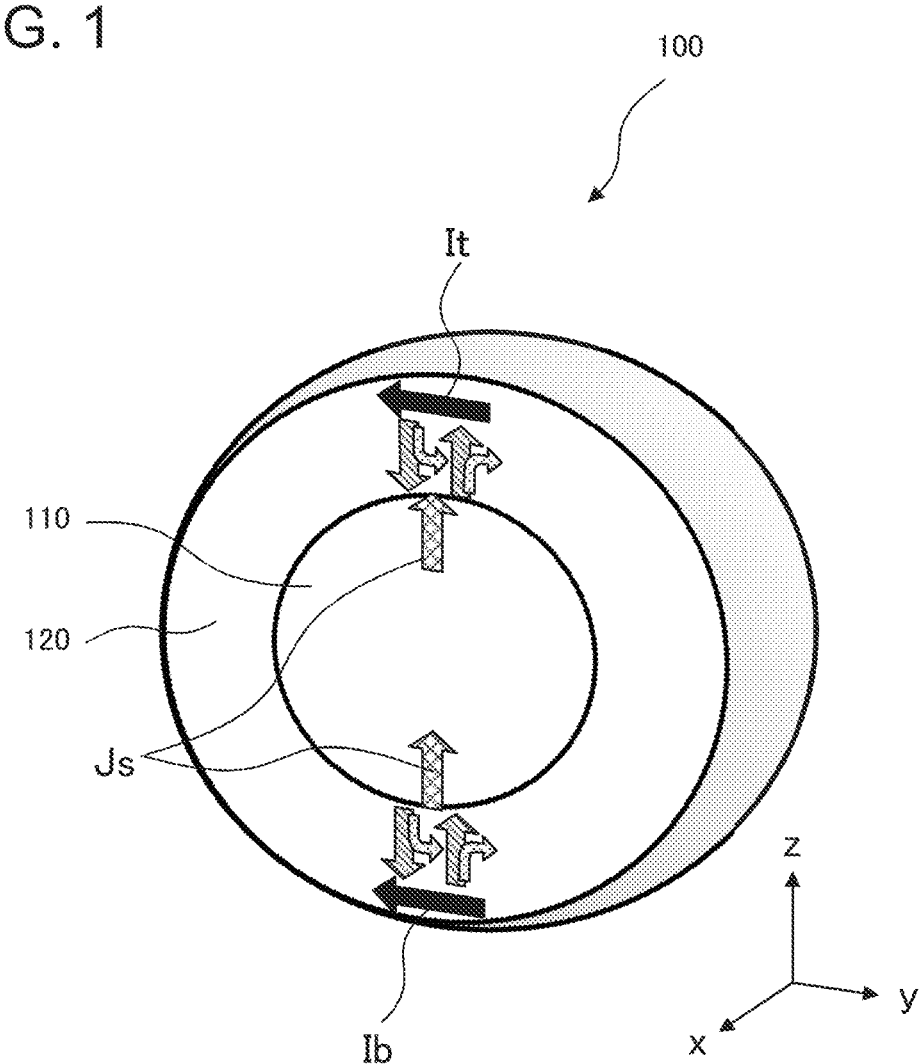
FIG. 1 is a cross sectional view illustrating a configuration of a thermoelectric conversion unit structure included in a thermoelectric conversion structure in accordance with a first exemplary embodiment of the present invention.

Next, first, the thermoelectric conversion unit structure included in the thermoelectric conversion structure in the present exemplary embodiment will be described. FIG. 1 is a cross sectional view illustrating a configuration of a thermoelectric conversion unit structure 100 included in the thermoelectric conversion structure in accordance with the first exemplary embodiment of the present invention.

The thermoelectric conversion unit structure 100 includes a magnetic fine particle 110 composed of a particulate magnetic material. The magnetic fine particle 110 has a typical three-dimensional shape such as a sphere, an ellipsoid, a pyramid, a frustum, a hexahedron, and other polyhedron. The shape of the magnetic fine particle 110 is not limited to these shapes. It can be an amorphous shape such as a shape of a fragment obtained by crushing a solid material, and a shape of a substance solidified, deposited, or cohered from the liquid phase or the vapor phase to the solid phase. At least a part of the magnetic material composing the magnetic fine particle 110 can be configured to have a structure in which the spin-current is not likely to be dissipated. That is to say, it is preferred that the magnetic fine particle 110 is composed of a magnetic material with high crystallinity and it is most favorable to be a single crystal.

The grain size of the magnetic fine particle 110 typically ranges from one micrometer ($\mu$m) to ten micrometers ($\mu$m) and is approximately 100 micrometers ($\mu$m) at a maximum. It is preferred that the grain size of the magnetic fine particle 110 is approximately equal to a diffusion length of a thermal magnon in the magnetic material composing the magnetic fine particle 110. That is to say, the maximum size of the magnetic fine particle 110 can be configured to be smaller than the diffusion length of the thermal magnon in the magnetic material. The reason is that the thermal magnon is dissipated and the temperature difference in only a part of the fine particle can be utilized if the size of the fine particle is too large. Specifically, for example, it is estimated that a garnet based magnetic insulator crystal such as yttrium-iron garnet ($Y_3Fe_5O_{12}$:YIG) has a thermal magnon diffusion length raging from approximately 50 nanometers (nm) to 10 micrometers (μm). This value varies widely depending on the growth method. It is reported that the thermal magnon diffusion length can reach 10 micrometers (μm) to 100 micrometers (μm) theoretically.

The magnetic fine particle 110 is covered with the electromotive body 120. It is desirable that the electromotive body 120 includes a material such as a metal, a semiconductor, an oxide electrical conductor, an organic conductor and, in particular, a metal material with large spin orbit coupling. For example, the electromotive body 120 can be configured to include the metal material with a spin hall angle being equal to or more than 0.001, wherein the spin hall angle is defined as the ratio of spin hall conductivity to electrical conductivity. Specifically, the electromotive body 120 can be configured so that the metal material may include at least one of gold (Au), platinum (Pt), palladium (Pd), nickel (Ni), iron (Fe), tungsten (W), and tantalum (Ta). The electromotive body 120 typically ranges from several nanometers (nm) to several hundred nanometers (nm) in thickness. In particular, it is preferred that the thickness of the electromotive body 120 is made approximately equal to the diffusion length of the spin-current in the metal material composing the electromotive body 120. The reason is as follows: it becomes impossible to convert the spin-current into the electric current sufficiently if the film thickness is equal to or smaller than the diffusion length, and the amount of the generated electric current is saturated and the internal resistance of the electromotive body decreases if the film thickness becomes equal to or larger than the diffusion length, in any case of which the amount of the electric power that can be taken out is reduced.

Next, the operation of the thermoelectric conversion unit structure 100 will be described using FIG. 1.

As mentioned above, the thermoelectric conversion unit structure 100 is composed of the magnetic fine particle 110 whose shape is spherical typically and the electromotive body 120. Here, it will be described where the magnetic fine particle 110 has magnetization M in the negative x direction and there is a uniform temperature gradient oriented in the negative z direction throughout the thermoelectric conversion unit structure 100.

Figure 9:
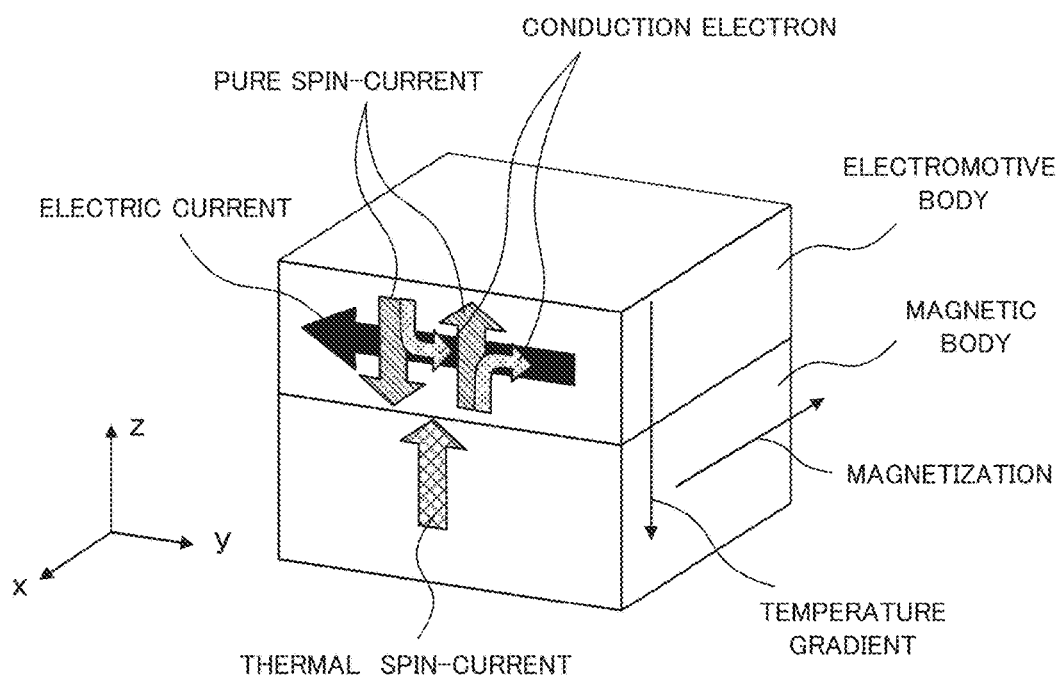
FIG. 9 is a schematic, perspective view to describe a thermoelectric conversion operation in a related spin-current thermoelectric conversion element.

When there is the temperature gradient, a spin-current Js arises in a direction opposite to the temperature gradient. This makes a top electric current It arise in the direction of the cross product Js×M of the spin-current Js and the magnetization M, that is, in the negative y direction, in the upper section of the thermoelectric conversion unit structure 100, as is the case in the above description using FIG. 9. On the other hand, in the lower section of the thermoelectric conversion unit structure 100, a bottom electric current Ib also arises in the same direction as the top electric current It because the direction of the spin-current Js and the direction of the magnetization M stay unchanged. Although there is a case in which the electric currents It and Ib arise in the positive y direction depending on the material composing the electromotive body, it will be described below as an example where each of the electric currents It and Ib arises in the negative y direction.

Figure 2:
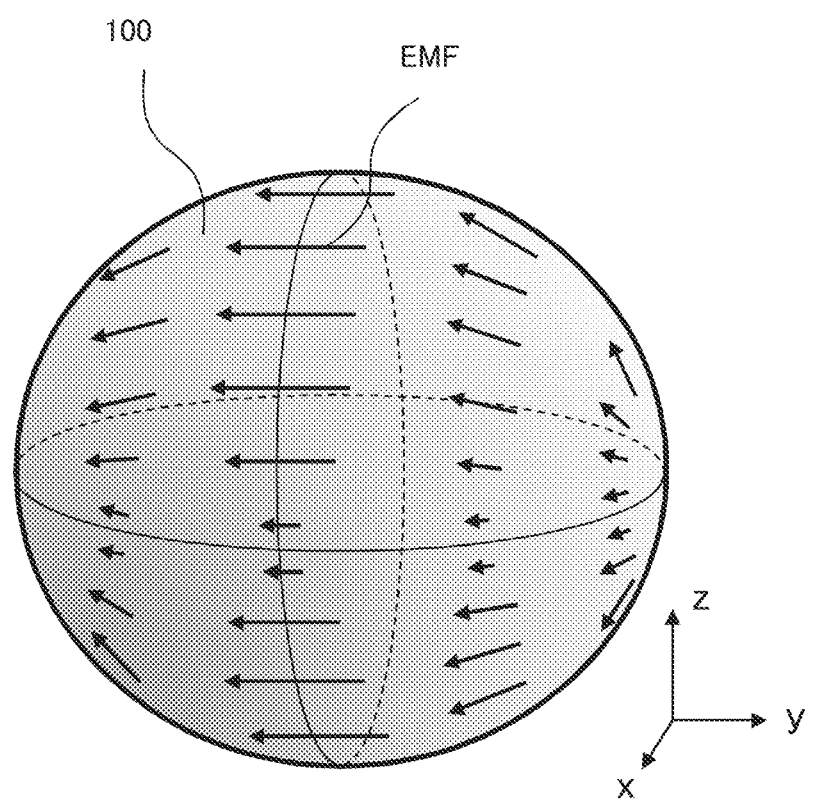
FIG. 2 is a schematic view to describe an operation of a thermoelectric conversion unit structure included in a thermoelectric conversion structure in accordance with a first exemplary embodiment of the present invention.

FIG. 2 shows a distribution of an electromotive force arising on the surface of the thermoelectric conversion unit structure 100. FIG. 2 shows a case in which there is the uniform temperature gradient oriented in the negative z direction throughout the thermoelectric conversion unit structure 100. The electromotive force EMF arises within the electromotive body on the surface of the thermoelectric conversion unit structure 100. The electromotive force EMF is oriented in the direction from a pole in the positive y direction to a pole in the negative y direction.

The spin injection does not arise on the circumference of circle corresponding to the equator along z=0 because the spin-current Js becomes parallel to the interface between the magnetic body and the electromotive body. Therefore, the electromotive force EMF due to the spin Seebeck effect and the inverse spin Hall effect is reduced to zero. Accordingly, if the thermoelectric conversion unit structure 100 lies alone, the entire electromotive force decreases because the electromotive force oriented in the negative y direction arising in the area of the upper hemisphere and the lower hemisphere (|z|>0) becomes short circuit condition along the path on the equator. However, since the short circuit path is infinitesimally small in width and converges at zero, the impedance reaches an infinite value. Therefore, the effect of the decrease in the electromotive force is limited and the electromotive force oriented in the negative y direction is never reduced to zero.

Figure 3:
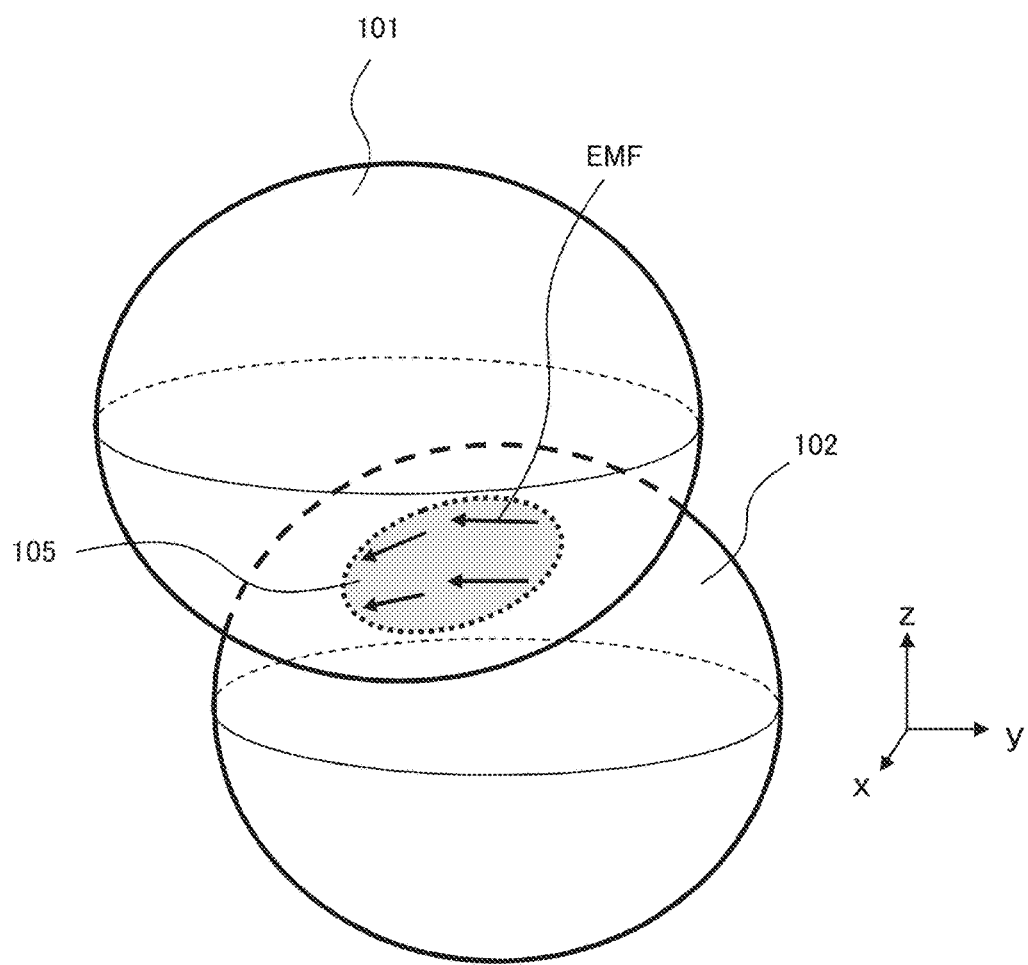
FIG. 3 is a schematic view to describe another operation of a thermoelectric conversion unit structure included in a thermoelectric conversion structure in accordance with a first exemplary embodiment of the present invention.

Next, the case will be described using FIG. 3 in which two thermoelectric conversion unit structures, that is, a first thermoelectric conversion unit structure 101 and a second thermoelectric conversion unit structure 102, are in contact with each other on a contact surface 105. Even if the thermoelectric conversion unit structure 100 is utilized alone, the function of the thermoelectric conversion can be obtained. However, it is preferred to use a plurality of thermoelectric conversion unit structures together in order to get large electric power, because the output electric power obtained by the thermoelectric conversion element is proportional to the volume of the element. In FIG. 3, as is the case in FIG. 1, two thermoelectric conversion unit structures 101 and 102 are magnetized in the negative x direction respectively. The temperature gradient arises which is oriented in the direction from a pole in the positive z direction of the first thermoelectric conversion unit structure 101 to a pole in the negative z direction of the second thermoelectric conversion unit structure 102. The thermoelectric conversion unit structure is covered by the atmosphere.

In this case, both the heat current and the spin-current penetrate the contact surface 105 and flow from the second thermoelectric conversion unit structure 102 to the first thermoelectric conversion unit structure 101. The electromotive force EMF arises on the contact surface 105 in the direction shown in FIG. 3 by means of both the spin-current flowing into it from the second thermoelectric conversion unit structure 102 and the spin-current flowing out to the first thermoelectric conversion unit structure 101. Therefore, the output electric power per unit area is doubled in ideal conditions. If the contact area between the thermoelectric conversion unit structures is localized, the heat current converges on the area where solids are in contact with each other. Therefore, the effect makes the output power per unit area on the contact surface 105 increase.

On the other hand, if there is an area without making contact with the solid, the heat current released to atmosphere from the area is very small compared with the heat current conducting through the solid. Therefore, the thermal electromotive force arising in the area without making contact with the solid becomes very small. As a result, the thermal electromotive force arising on the contact surface 105 may short-circuit.

Figure 4:
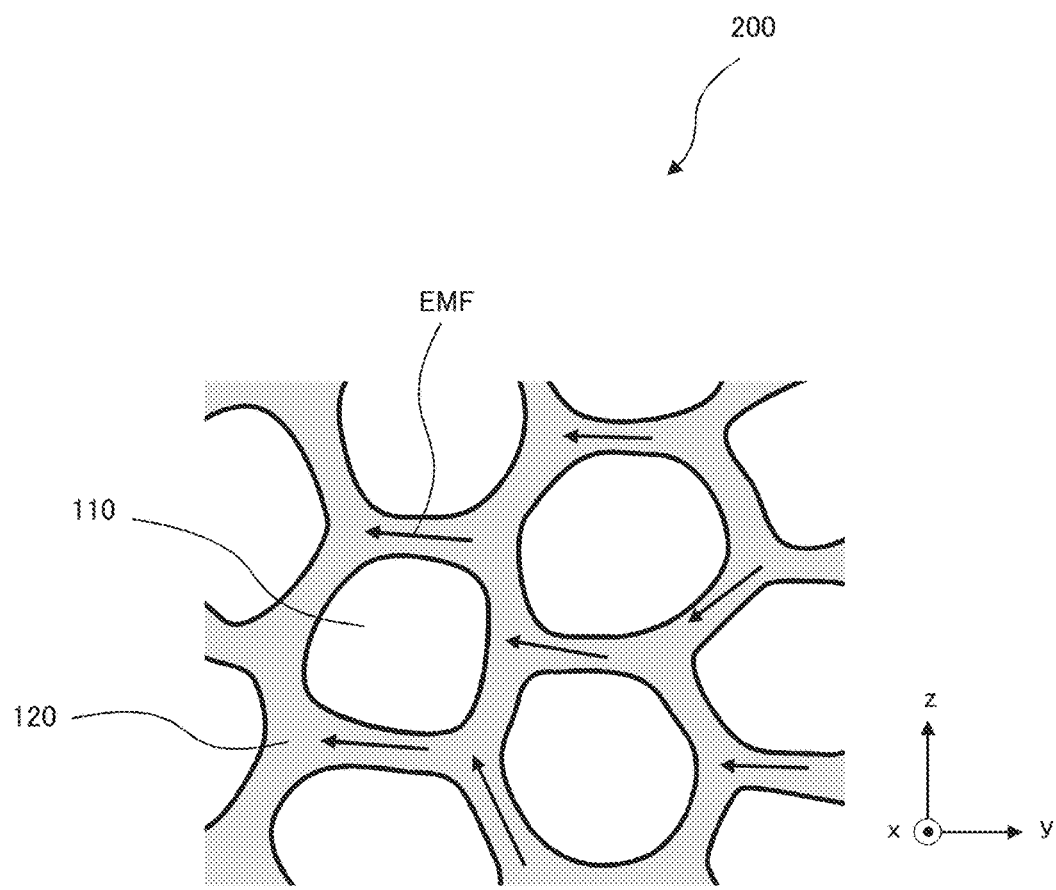
FIG. 4 is a schematic view illustrating a configuration of an aggregate with a plurality of thermoelectric conversion unit structures connecting to each other included in a thermoelectric conversion structure in accordance with a first exemplary embodiment of the present invention.

Next, an aggregate will be described in which a plurality of the thermoelectric conversion unit structures 100 aggregate and the electromotive bodies 120 connect to each other. The aggregate configures the thermoelectric conversion structure according to the present exemplary embodiment. FIG. 4 illustrates a configuration of an aggregate 200 with a plurality of thermoelectric conversion unit structures connecting to each other schematically.

The each magnetization direction of the magnetic materials composing a plurality of magnetic fine particles 110 is the same as others. Here, it is assumed that the magnetic fine particle 110 is magnetized in the negative x direction in FIG. 4. If both the heat current and the spin-current flow in the positive z direction, the electromotive force EMF arises in arrow direction shown in FIG. 4 in the electromotive bodies 120 with network-like connection. The electromotive force arises in the negative y direction in the aggregate 200 as a whole.

Thus, if a plurality of the thermoelectric conversion unit structures 100 are closely located at random, the electromotive forces arising in neighboring thermoelectric conversion unit structures overlap even in the short circuit path on the equator described by using FIG. 2. Therefore, the area in which the electromotive force is reduced to zero decreases to a negligible small value.

It is also acceptable that the thermoelectric conversion unit structure 100 and a conductive binder are used in combination in the aggregate 200 so that the thermoelectric conversion unit structures 100 can be electrically connected to each other more closely. It is possible to use, as the conductive binder, conductive materials with a shape of nanometer or micrometer dimension such as a foil made of a metal or a conductive polymer, a nanowire, a micro-wire, a nanoparticle, a micro-particle. If the conductive binder is used, an effective relaxation length of the spin-current decreases because foreign materials get stuck in the electromotive body. Therefore, it is possible to prevent the thermal spin-current from penetrating into the adjacent magnetic body without being sufficiently converted into the electric current in the electromotive body. As a result, it becomes possible to improve the efficiency of the spin-current to electric current conversion.

Figure 5:
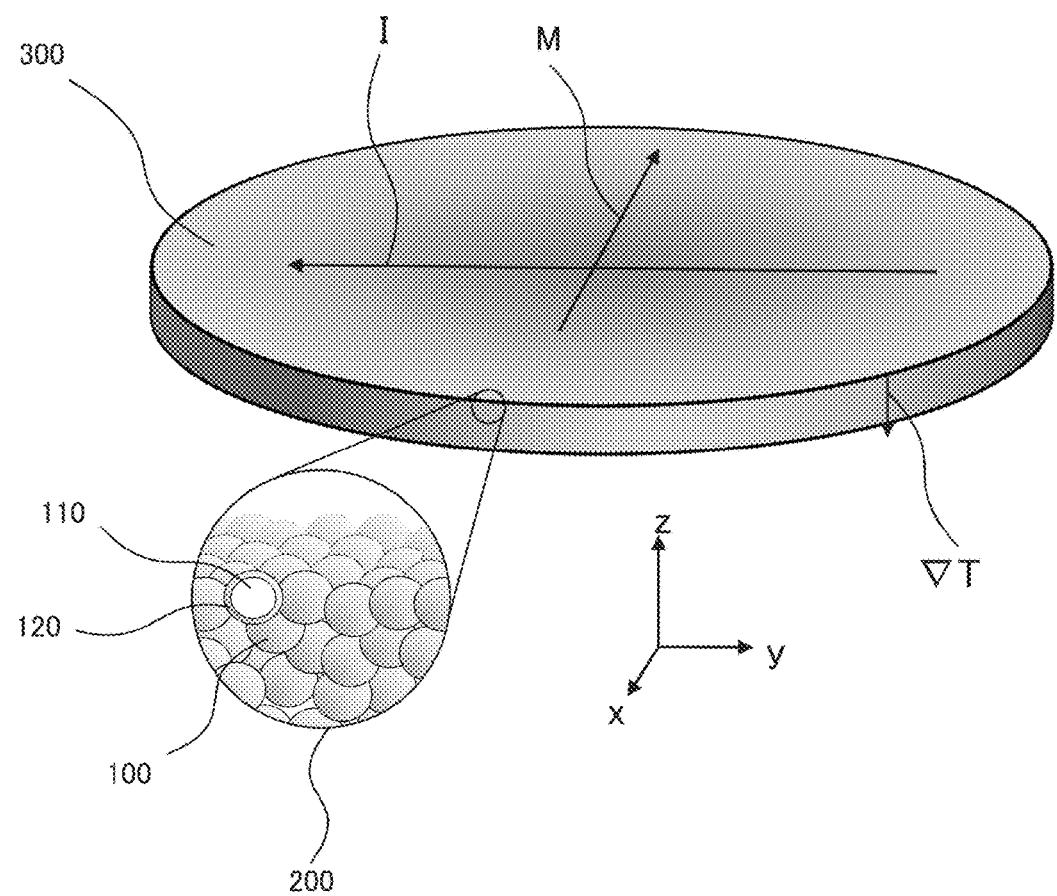
FIG. 5 is a perspective view schematically illustrating a configuration of a thermoelectric conversion structure in accordance with a first exemplary embodiment of the present invention.

FIG. 5 schematically illustrates a configuration of a thermoelectric conversion structure 300 composed of the above-mentioned aggregate. As described above, the thermoelectric conversion structure 300 in accordance with the present exemplary embodiment includes the thermoelectric conversion unit structure 100 including the magnetic fine particle 110 including the magnetic material with the spin Seebeck effect arising and the electromotive body 120 with which to cover the magnetic fine particle 110. A plurality of the thermoelectric conversion unit structures 100 form the aggregate 200 with the electromotive bodies 120 connecting to each other.

As shown in FIG. 5, the each magnetization direction M of the magnetic materials included in a plurality of the thermoelectric conversion unit structures 100 is the same as others, and it is oriented in the negative x direction in this case. If the temperature gradient (nabla T) arises in the negative z direction in FIG. 5, the electric current I flowing in the negative y direction arises in the thermoelectric conversion structure 300 by means of the spin Seebeck effect and the inverse spin Hall effect.

As mentioned above, the thermoelectric conversion structure 300 according to the present exemplary embodiment is configured to form the aggregate 200 with a plurality of the thermoelectric conversion unit structures 100 connecting to each other. That is to say, since the aggregate 200 is configured to include the magnetic fine particle 110 covered with the electromotive body 120, the thermoelectric conversion structure 300 does not become less flexible even if its thickness in the direction of the temperature gradient (nabla T) increases. Therefore, according to the thermoelectric conversion structure 300 in the present exemplary embodiment, it is possible to obtain, without raising production costs, the thermoelectric conversion element using the spin-current which has a high degree of freedom for implementing it on a heat source and whose output power is increased.

Next, the materials will be described which are used for the thermoelectric conversion structure 300 according to the present exemplary embodiment.

The magnetic fine particle 110 includes a magnetic material with the spin Seebeck effect arising. The magnetic material is a material having magnetic properties such as ferromagnetism, ferrimagnetism, and antiferromagnetism, and can be any one of metal, semiconductor, and insulator. For example, it is possible to use, as a ferromagnetic metal, a metal including at least one selected from iron (Fe), cobalt (Co), and nickel (Ni), such as NiFe, CoFe, CoFeB.

It is possible to use, as a magnetic insulator, yttrium-iron garnet ($Y_3Fe_5O_{12}$; YIG), bismuth (Bi)-doped YIG (Bi:YIG), lanthanum (La)-doped YIG ($LaY_2Fe_5O_{12}$), yttrium gallium iron garnet ($Y_3Fe_{5-x}Ga_xO_{12}$), and the like. It is also acceptable to use a spinel ferrite material composed of a chemical composition of $MFe_2O_4$ (M representing a metal element including any one of Ni, Zn, and Co).

It is possible to use, as a magnetic semiconductor, a magnetic oxide (a magnetic oxide semiconductor) having a semiconducting property and including at least one selected from Fe, Co, and Ni such as $CuMO_2$, $SrMO_3$ (M representing a metal element including any one of Mn, Ni, Co, and Fe), and $Fe_3O_4$. It is desirable to use magnetic materials having insulation properties or semiconductor properties in order to suppress the heat conduction due to the conduction electrons.

If the magnetic material with metal properties or semiconductor properties is used, the electromotive force due to the anomalous Nernst effect arises. The anomalous Nernst effect is a phenomenon that the voltage arises, when the heat current flows in the magnetized magnetic body, in a direction perpendicular to each of the direction of the magnetization and the direction of the heat current (the direction of the cross product). Because the anomalous Nernst effect generates the thermal electromotive force in the same direction as the thermal electromotive force due to the spin Seebeck effect and the inverse spin Hall effect, it is possible to obtain the effect of boosting the output power from the whole of the thermoelectric conversion structure 300. Similarly, it is possible to obtain the effect of boosting the output power by the normal state Nernst effect.

It is possible to use, as materials composing the electromotive body 120, electrical conducting materials with the inverse spin Hall effect arising. For example, it is possible to use gold (Au) or platinum (Pt) with a relatively large spin orbit coupling, transition metals with d orbital or f orbital such as palladium (Pd), nickel (Ni), iron (Fe), bismuth (Bi), or alloy materials containing above-described metals. It is also acceptable to use doped materials obtained by adding a material such as iron (Fe) and iridium (Ir) to a general metal film material such as copper (Cu) in concentrations approximately from 0.5 to 10 mol %.

If any one of tungsten (W), tantalum (Ta), molybdenum (Mo), niobium (Nb), chromium (Cr), vanadium (V), and titanium (Ti) in the transition metals is used, the voltage can be obtained whose sign is reverse to that using any one of gold (Au), platinum (Pt), palladium (Pd) and alloys containing them. This is because the direction of electric current arising due to the inverse spin Hall effect is inverted in those metals. It is also acceptable to use oxide conductors such as indium tin oxide (ITO), iridium oxide, and rhenium oxide, or magnetic oxide semiconductors such as $CuMO_2$ and $SrMO_3$ (M represents a metal element including any one of Mn, Ni, Co, and Fe) as the material composing the electromotive body 120.

Next, a method for making the thermoelectric conversion structure 300 according to the present exemplary embodiment will be described.

In the method for making the thermoelectric conversion structure 300 according to the present exemplary embodiment, first, the magnetic fine particle 110 is formed by using a magnetic material with the spin Seebeck effect arising. Next, the thermoelectric conversion unit structure 100 is formed by covering the magnetic fine particle 110 with the electromotive body 120. The aggregate 200 of the plurality of thermoelectric conversion unit structures 100 is formed by connecting a plurality of the electromotive bodies 120 included in a plurality of the thermoelectric conversion unit structures 100 to each other. As a result, the thermoelectric conversion structure 300 according to the present exemplary embodiment is completed.

It is possible to use, as methods for forming the magnetic fine particle 110, methods of preparation using a liquid phase such as a sol-gel method, a micelle method, a coprecipitation method, and a reduction method, or a vapor phase growth method vaporizing and reaggregating raw materials by using a laser, an arc discharge, or a plasma, and the like. In addition, it is possible to use an atomization method of producing a particle by atomizing raw material solution in water, air, vacuum and the like, a milling method of producing a particle by crushing a bulk, or the like.

Since it is preferred that the magnetic fine particle 110 is crystalline, it is also acceptable to improve the crystallinity by heat-treating the formed particles in an appropriate atmosphere.

It is possible to use, as a method for forming the electromotive body 120, a film formation method such as a sputter method, a vapor deposition method, a plating method, a screen printing method, an ink jet method, a spray method, and a spin coat method. It is also acceptable to use a formation method using a coating or a sintering of nano-colloidal solution.

A Second Exemplary Embodiment

Next, a second exemplary embodiment of the present invention will be described. A thermoelectric conversion element according to the present exemplary embodiment includes a thermoelectric conversion structure and two electrodes electrically connecting to the electromotive body composing the thermoelectric conversion structure respectively and disposed apart from each other.

Here, the configuration of the thermoelectric conversion structure is the same as that of the thermoelectric conversion structure 100 described in the first exemplary embodiment. That is to say, the thermoelectric conversion structure 100 includes the thermoelectric conversion unit structure 100 including the magnetic fine particle 110 including the magnetic material with the spin Seebeck effect arising and the electromotive body 120 with which to cover the magnetic fine particle 110. A plurality of the thermoelectric conversion unit structures 100 form the aggregate 200 with the electromotive body 120 connecting to each other.

A thermoelectric conversion element will be described in the present exemplary embodiment in which the aggregate 200 mentioned above has any one of a flat-plate shape and a thin-film shape.

Figure 6:
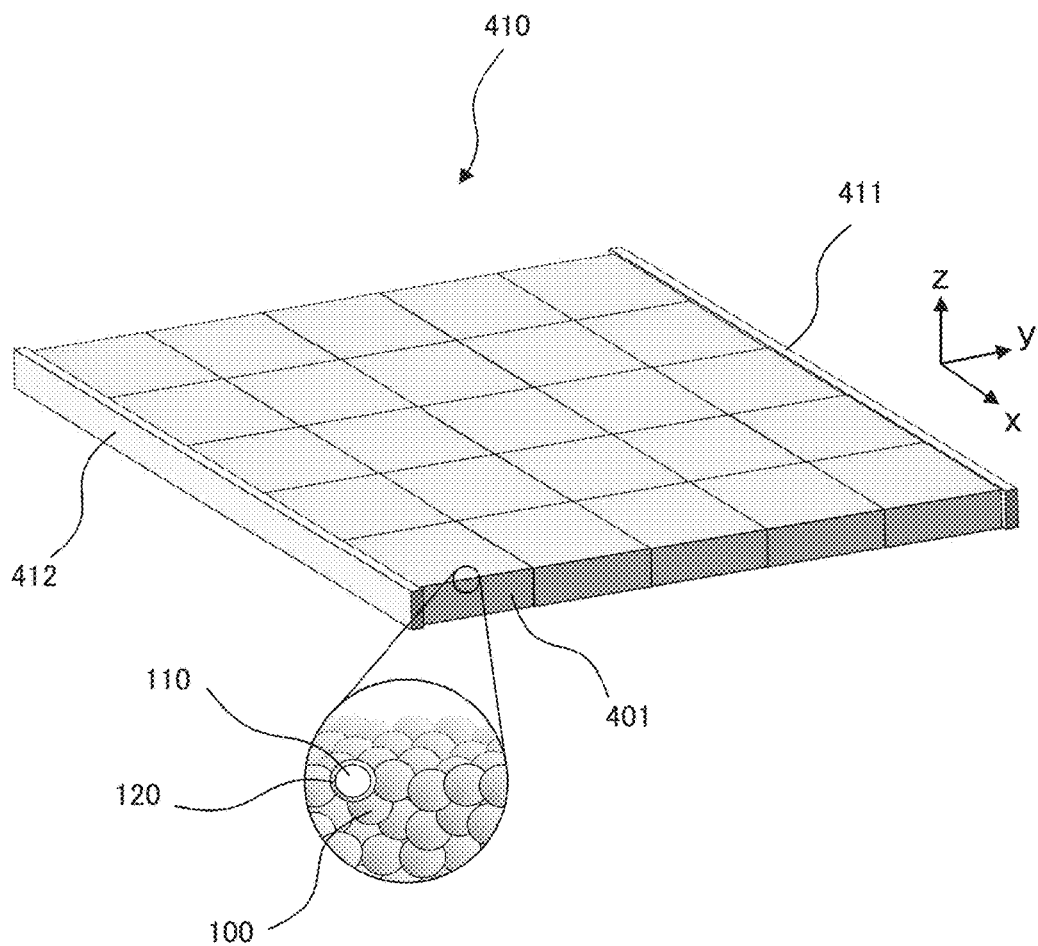
FIG. 6 is a perspective view schematically illustrating a configuration of a flat-plate thermoelectric conversion element in accordance with a second exemplary embodiment of the present invention.

FIG. 6 illustrates a configuration of a flat-plate thermoelectric conversion element 410 in accordance with the present exemplary embodiment. The flat-plate thermoelectric conversion element 410 is configured for a plurality of flat-plate thermoelectric conversion structures 401 in which the aggregate has a flat-plate shape to be connected to each other. Therefore, it is possible to configure the flat-plate thermoelectric conversion structure 401 to fit the size of a heat source. As a result, according to the flat-plate thermoelectric conversion element 410 in the present exemplary embodiment, it is possible to realize, without raising the production costs, the thermoelectric conversion element using the spin-current which has a high degree of freedom for implementing it on a heat source and whose output power is increased.

The flat-plate thermoelectric conversion element 410 includes two electrodes 411 and 412 electrically connecting to the electromotive bodies 120 and disposed apart from each other. The electric current arises in the negative y direction by applying the magnetization oriented in the negative x direction to each of the flat-plate thermoelectric conversion structures 401 and applying a uniform temperature gradient oriented in the negative z direction to the whole of the flat-plate thermoelectric conversion element 410. The arisen electric current can be taken out efficiently by the electrodes 411 and 412 made of materials having superior electrical conductivity such as copper.

It is possible to maintain good electrical connections by inserting conductive grease, paste, powder, and the like between the flat-plate thermoelectric conversion structures 401 lying next to each other. It is also possible to maintain the neighboring flat-plate thermoelectric conversion structures 401 so as not to separate physically by supporting the flat-plate thermoelectric conversion element 410 using a thermally-conductive and insulating sheet.

Next, a thermoelectric conversion element will be described which includes the thermoelectric conversion structure in which the aggregate 200 has a thin-film shape.

Figure 7:
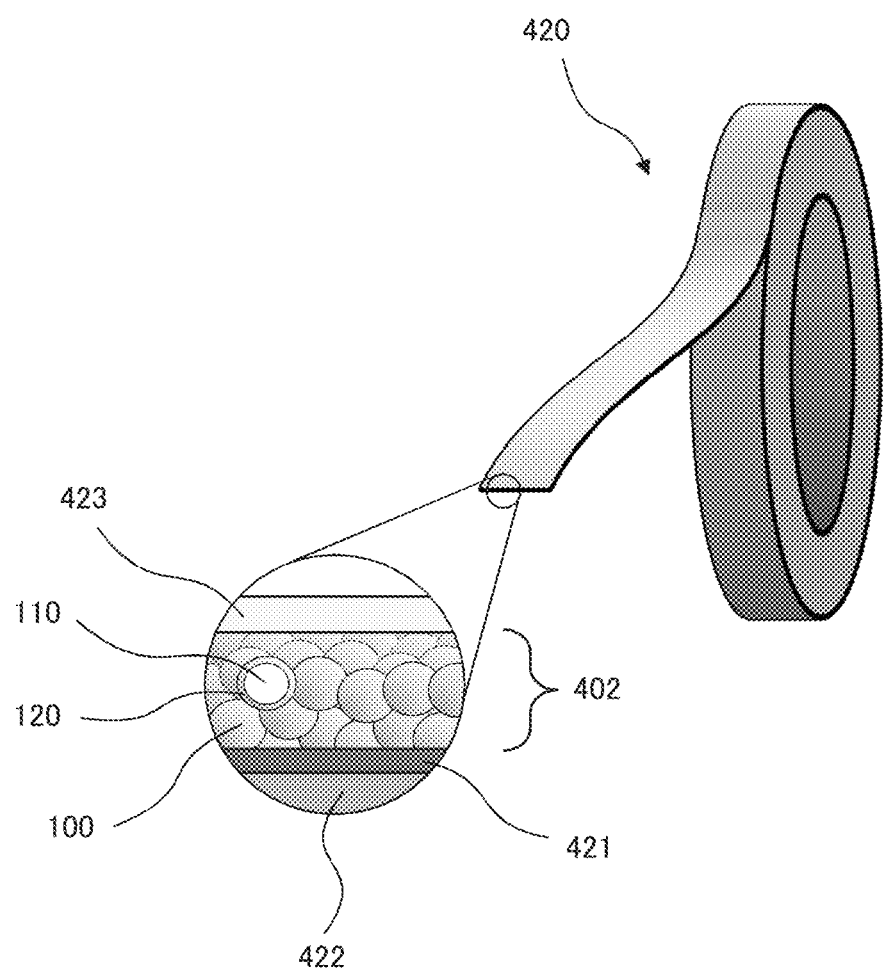
FIG. 7 is a perspective view schematically illustrating a configuration of a thin-film thermoelectric conversion element in accordance with a second exemplary embodiment of the present invention.

FIG. 7 illustrates a configuration of a thin-film thermoelectric conversion element 420 according to the present exemplary embodiment. The thin-film thermoelectric conversion element 420 has a thin-film thermoelectric conversion structure 402 in which the aggregate has a thin-film shape.

The thin-film thermoelectric conversion element 420 can have a tape shape as shown in FIG. 7, for example. In this case, the thin-film thermoelectric conversion structure 402 can be configured to form it in a roll shape with a tape support film 421, an adhesive film 422, and a protection film 423. It is possible to increase the tensile strength and the bending strength or improve the electrical conductivity of the thin-film thermoelectric conversion structure 402 by using a material which is obtained by combining the thermoelectric conversion unit structure 100 with a binder material in forming the thin-film thermoelectric conversion structure 402 in a roll shape.

The thin-film thermoelectric conversion element 420 is completed by connecting a pair of electrodes apart by a predetermined distance in a direction perpendicular to the magnetization in the thin-film thermoelectric conversion structure 402 and applying the magnetization in the across-the-width direction of the tape.

It is possible to use the thin-film thermoelectric conversion element 420 attaching it to a heat source in arbitrary length. Therefore, according to the thin-film thermoelectric conversion element 420 in the present exemplary embodiment, it is possible to realize, without raising production costs, the thermoelectric conversion element using the spin-current which has a high degree of freedom for implementing it on a heat source and whose output power is increased.

Figure 8:
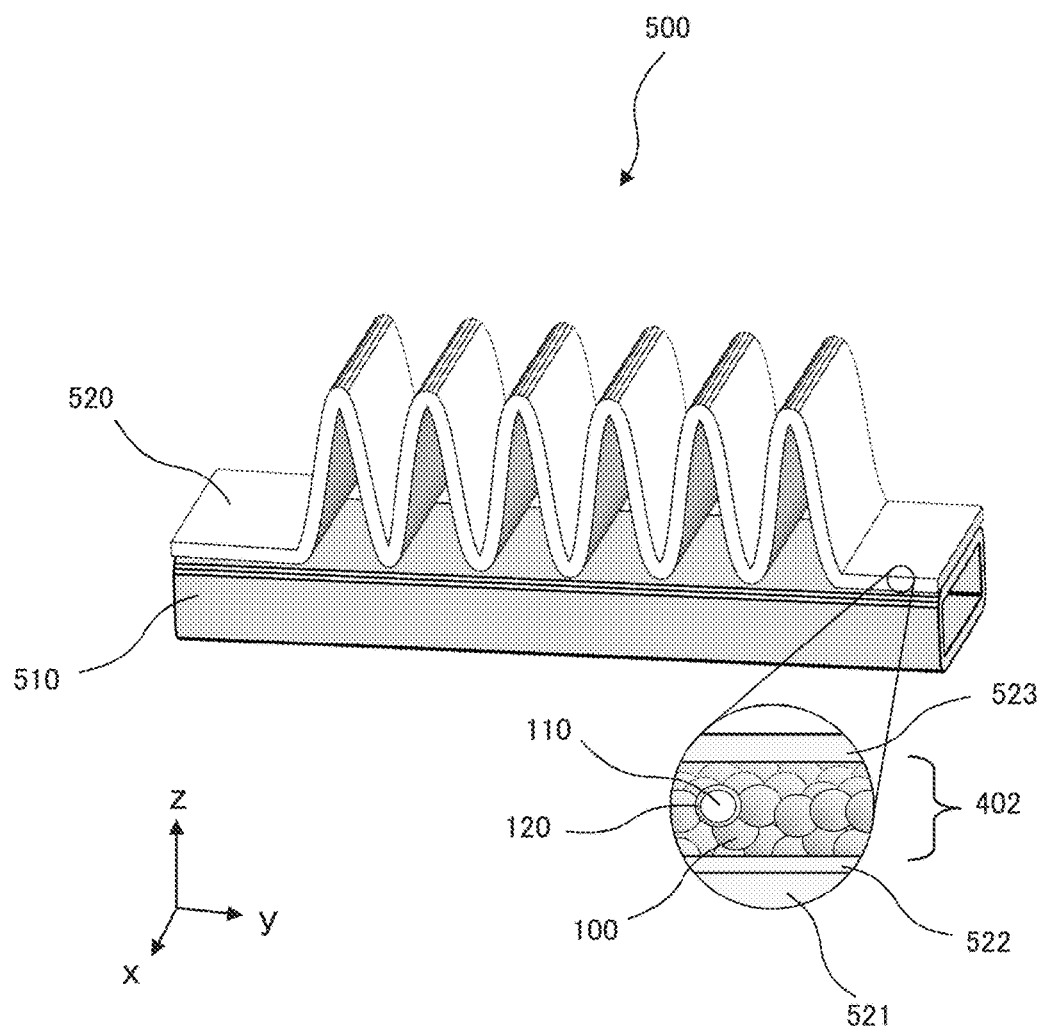
FIG. 8 is a perspective view schematically illustrating a configuration of a vapor-liquid heat exchanger including a fin with a thermoelectric conversion element in accordance with a second exemplary embodiment of the present invention.

FIG. 8 illustrates an example in which the thin-film thermoelectric conversion structure 402 is implemented in a fin composing a vapor-liquid heat exchanger. The vapor-liquid heat exchanger 500 is composed of a pipe 510 through which a liquid flows and a fin to increase the area for a heat exchange with outside air. Since the thin-film thermoelectric conversion structure 402 according to the present exemplary embodiment has the flexibility, it can be implemented on the surface of the fin. This enables to configure a fin with the thermoelectric conversion element 520 in which the thin-film thermoelectric conversion element is implemented.

The fin with the thermoelectric conversion element 520 will be described in more detail below.

In order to make the fin with the thermoelectric conversion element 520, first, the thin-film thermoelectric conversion structure 402 is implemented on a ribbon-like aluminum plate 521 to be a material of a fin structure. Specifically, it is possible to fix the thin-film thermoelectric conversion structure 402 that is an aggregate of the thermoelectric conversion unit structures 100 on the aluminum plate 521 by disposing a plurality of the thermoelectric conversion unit structures 100 on the surface of the aluminum plate 521 and performing hot pressing process in the atmosphere. Since an oxide film 522 is formed on the surface of the aluminum plate 521 by heating at this time, the thin-film thermoelectric conversion structure 402 is insulated from the aluminum plate 521. It is possible to use bismuth-substituted yttrium iron garnet ($BiY_2Fe_5O_{12}$:BYIG) as the magnetic fine particle 110 composing the thermoelectric conversion unit structure 100 and use platinum (Pt) as the electromotive body 120, for example.

After mounting the thin-film thermoelectric conversion structure 402 on the aluminum plate 521, a protection film 523 obtained by using insulating diamond-like carbon for example is formed on the surface by means of a plasma deposition method and the like. The fin 520 with the thermoelectric conversion element can be obtained by making the aluminum plate 521 on which to mount the thin-film thermoelectric conversion structure the fin geometry, and forming the electrodes removing the protection film 523 at the both ends of the fin. The fin with the thermoelectric conversion element 520 is placed on the pipe 510, so that the vapor-liquid heat exchanger 500 is completed.

By applying a magnetic field in a direction (x direction) perpendicular to a drawing direction (y direction) of the pipe 510 composing the vapor-liquid heat exchanger 500, the magnetic fine particle 110 composing the thin-film thermoelectric conversion structure 402 is magnetized in the direction. Since the heat current (spin-current) arises in the z direction, the electromotive force oriented in the y direction arises in the fin with the thermoelectric conversion element 520.

As mentioned above, according to the present exemplary embodiment, it is possible to obtain, without raising production costs, the thermoelectric conversion element using the spin-current which has a high degree of freedom for implementing it on a heat source and whose output power is increased.

Example 1

An example of the thermoelectric conversion structure and a method for making the same in accordance with the first exemplary embodiment of the present invention will be described below.

In the present example, first, the magnetic fine particle 110 is made by means of a milling method. Here, a sintered body of bismuth-substituted yttrium iron garnet ($BiY_2Fe_5O_{12}$:BYIG) is crushed by using a jet mill. Next, the magnetic fine particle 110 is subjected to heat treatment. The heat treatment is performed for 24 hours at 800 degrees Celsius in the presence of 100% pure oxygen. Under these conditions, an average grain size of the magnetic fine particle 110 is equal to approximately four micrometers (μm).

Next, the electromotive body 120 is formed by using a magnetron sputtering device. The above-mentioned magnetic fine particle 110 after the oxidation treatment is placed on a stage with a stirrer and evacuating process is performed.

A platinum film to be evaporated by sputtering a platinum target is used as a material of the electromotive body 120. A stirring speed of the magnetic fine particle 110, a time for the sputtering deposition, and an output power of plasma are adjusted so that an average thickness of the platinum film may become equal to two nanometers (nm).

A pressure of 200 weight kilogram per square centimeter ($kgf/cm^2$) is applied using a press machine to the aggregate 200 of the thermoelectric conversion unit structures 100 formed by evaporating the electromotive body 120. This makes the aggregate 200 shaped into a circular substrate of two centimeters (cm) in diameter and two millimeters (mm) in thickness, so that the thermoelectric conversion structure 300 is completed (see FIG. 5).

When the magnetization M is applied in the negative x direction to the thermoelectric conversion structure 300 formed as mentioned above and a uniform temperature gradient (nabla T) oriented in the negative z direction is applied to the whole of the thermoelectric conversion structure 300, the electric current I flowing in the negative y direction arises. Concretely speaking, the heat current generating the temperature difference up to ten degrees Celsius in the z direction is inputted in the positive z direction of the thermoelectric conversion structure 300. In this case, it is possible to obtain an open voltage of two millivolts (mV) oriented in the y direction due to the electric current I. Since the internal resistance in the y direction of the thermoelectric conversion structure 300 is equal to one ohm (Ω), the maximum extractable electric power is estimated at one microwatt (μV).

Example 2

Another example of the thermoelectric conversion structure and a method for making the same in accordance with the first exemplary embodiment of the present invention will be described below.

In the present example, the magnetic fine particle 110 composed of yttrium-iron garnet ($Y_3Fe_5O_{12}$: YIG) is made by a sol-gel method. A general procedure of the sol-gel method enables to produce the magnetic fine particle 110 with the average grain size equal to approximately one micrometer (μm). After drying the produced magnetic fine particle 110 sufficiently, the heat treatment is performed additionally at 600 degrees Celsius in the atmosphere.

Next, a nickel (Ni) thin film as the electromotive body 120 is formed around the magnetic fine particle 110 by using an electroless plating process. A cleaning process is performed as a pretreatment for a plating process using a SPM (Sulfuric acid-hydrogen Peroxide Mixture) cleaning liquid diluted 20-fold. After the plating process, the heat treatment is performed at 400 degrees Celsius in the atmosphere, and the thermoelectric conversion unit structure 100 is obtained.

The aggregate 200 of the obtained thermoelectric conversion unit structures 100 is shaped into a circular form as is the case with Example 1 and the thermoelectric conversion structure 300 is completed. According to the present example, the thermoelectric output can be also obtained which is similar to that in Example 1.

As mentioned above, in order to improve the basic performance of the thermoelectric conversion element using the spin-current, it is important to improve three indexes, that is, the amount of the spin-current arising in the magnetic body, the injection efficiency of the spin-current at the interface between the magnetic body and the electromotive body, and the spin-current to electric current conversion efficiency in the electromotive body.

In addition, in order to build a practical thermoelectric conversion system using the spin-current thermoelectric conversion element, it is required to enlarge the size of the element and make the implementation easier in addition to the above-mentioned conditions. That is to say, it is necessary to increase the output power by enlarging the size of the element and increasing the effective volume, and to have a structure where the implementation on various shaped heat sources is easy and good thermal contact can be obtained.

These points will be described more in detail below.

With respect to enlarging the size of the element, it becomes important in particular to increase the thickness of the element. The reason is as follows. When a constant heat current arises in each thermoelectric conversion element with the same structure, the temperature difference arising between the both sides of the element is proportional to the thickness of the element. Therefore, since the temperature difference arising between the both sides of the element differs thousandfold between the element one micrometer (μm) thick and the element one millimeter (mm) thick, for example, the output power differs thousandfold.

However, since it is difficult to make the spin-current thermoelectric conversion element more than 10 micrometers (μm) thick, it is necessary to stack the spin-current thermoelectric conversion elements in order to make a thermoelectric conversion module more than millimeter (mm) order thick. As a result, there has been a problem that the production costs are raised and the flexibility of the thermoelectric conversion module is decreased.

Next, it will be described to implement the spin-current thermoelectric conversion element on heat sources. Here, the heat sources include a heat source with higher temperature than the environmental temperature and a cold source with lower temperature than the environmental temperature.

The element structure of the spin-current thermoelectric conversion element is simple compared to a semiconductor thermoelectric conversion element having a structure in which n-type semiconductor blocks and p-type semiconductor blocks are intricately connected. Therefore, the spin-current thermoelectric conversion element is suitable for implementation to the heat source. However, the flexibility of the element is decreased if the thickness of the spin-current thermoelectric conversion element exceeds 100 micrometers (μm). Therefore, there has been a problem that the production costs are raised because it is necessary to form an element with a shape specializing in each heat source.

Thus, there has been a problem that flexible implementation to a heat source becomes difficult and the production costs are raised adopting a structure to increase the output power in a thermoelectric conversion element using the spin-current.

An exemplary advantage according to the present invention is that it is possible to obtain, without raising production costs, a thermoelectric conversion element using the spin-current which has a high degree of freedom for implementing it on a heat source and whose output power is increased, according to a thermoelectric conversion structure and a method for making the same of the present exemplary embodiment.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The invention claimed is:

1. A thermoelectric conversion structure, comprising:
a plurality of thermoelectric conversion unit structures, wherein each thermoelectric conversion unit structure comprises a magnetic fine particle comprising a magnetic material that exhibits a spin Seebeck effect and an electromotive body that covers the magnetic fine particle,
wherein the electromotive bodies of the plurality of thermoelectric conversion unit structures are connected to each other,
the plurality of thermoelectric conversion unit structures forms an aggregate, and
all surfaces of each of the magnetic fine particles are in direct physical contact with the aggregate.

2. The thermoelectric conversion structure according to claim 1,
wherein a magnetization direction of the magnetic material in each of the plurality of thermoelectric conversion unit structures is the same.

3. The thermoelectric conversion structure according to claim 1,
wherein at least a part of the magnetic material has a crystal structure.

4. The thermoelectric conversion structure according to claim 1,
wherein the magnetic material is a material that exhibits a Nernst effect.

5. The thermoelectric conversion structure according to claim 1,
wherein a maximum size of each magnetic fine particle is smaller than a diffusion length of a thermal magnon in the magnetic material.

6. The thermoelectric conversion structure according to claim 1,
wherein each electromotive body comprises a metal material, and
a spin hall angle of the metal material is equal to or more than 0.001.

7. The thermoelectric conversion structure according to claim 1,
wherein each electromotive body comprises a metal material, and
the metal material comprises any one of gold, platinum, palladium, iridium, rhenium, nickel, iron, tungsten, and tantalum.

8. The thermoelectric conversion structure according to claim 1,
wherein the aggregate has any one of a flat-plate shape and a thin-film shape.

9. A thermoelectric conversion element, comprising:
the thermoelectric conversion structure according to claim 1; and
two electrodes electrically connecting to the aggregate and disposed apart from each other.

10. A method for making a thermoelectric conversion structure, comprising:
forming a magnetic fine particle by using a magnetic material with the spin Seebeck effect arising;
forming a thermoelectric conversion unit structure by covering the magnetic fine particle with an electromotive body; and
forming an aggregate of a plurality of thermoelectric conversion unit structures by connecting a plurality of the electromotive bodies comprised in the plurality of thermoelectric conversion unit structures to each other,
wherein all surfaces of each of the magnetic fine particles are in direct physical contact with the aggregate.

11. The thermoelectric conversion structure according to claim 2,
wherein at least a part of the magnetic material has a crystal structure.

12. The thermoelectric conversion structure according to claim 2,
wherein the magnetic material is a material that exhibits a Nernst effect.

13. The thermoelectric conversion structure according to claim 3,
wherein the magnetic material is a material that exhibits a Nernst effect.

14. The thermoelectric conversion structure according to claim 2,
wherein a maximum size of each magnetic fine particle is smaller than a diffusion length of a thermal magnon in the magnetic material.

15. The thermoelectric conversion structure according to claim 3,
wherein a maximum size of each magnetic fine particle is smaller than a diffusion length of a thermal magnon in the magnetic material.

16. The thermoelectric conversion structure according to claim 4,
wherein a maximum size of each magnetic fine particle is smaller than a diffusion length of a thermal magnon in the magnetic material.

17. The thermoelectric conversion structure according to claim 2,
wherein each electromotive body comprises a metal material, and
a spin hall angle of the metal material is equal to or more than 0.001.

18. The thermoelectric conversion structure according to claim 3,
wherein each electromotive body comprises a metal material, and
a spin hall angle of the metal material is equal to or more than 0.001.

19. The thermoelectric conversion structure according to claim 4,
wherein each electromotive body comprises a metal material, and
a spin hall angle of the metal material is equal to or more than 0.001.

20. The thermoelectric conversion structure according to claim 5,
wherein each electromotive body comprises a metal material, and
a spin hall angle of the metal material is equal to or more than 0.001.

* * * * *